US005563450A

United States Patent [19]

Bader et al.

[11] Patent Number: 5,563,450
[45] Date of Patent: Oct. 8, 1996

[54] SPRING GROUNDING CLIP FOR COMPUTER PERIPHERAL CARD

[75] Inventors: Ronald S. Bader, Boulder Creek; Michael W. Patterson, Pleasanton, both of Calif.

[73] Assignee: National Semiconductor Corporation, Santa Clara, Calif.

[21] Appl. No.: 379,825

[22] Filed: Jan. 27, 1995

[51] Int. Cl.⁶ .............................. H01L 23/02; H01L 23/34
[52] U.S. Cl. .................. 257/785; 257/678; 257/723; 257/726; 257/727; 361/600; 361/601; 361/679; 361/683
[58] Field of Search ............................ 361/600, 601, 361/649, 683, 684, 740, 741, 820, 825, 783, 679; 174/50; 257/678, 699, 723, 724, 726, 727, 785, 798

Primary Examiner—Sara W. Crane
Assistant Examiner—Carl Whitehead, Jr.

Attorney, Agent, or Firm—Skjerven, Morrill, MacPherson, Franklin & Friel; Thomas S. MacDonald; Paul J. Winters

[57] ABSTRACT

A peripheral card includes a two-part metal cover mounting a printed wiring board on a U-shaped plastic frame. The wiring board is spaced from inside surfaces of the cover preferably by a pair spring clips mountable on side edges of the wiring board, each clip having an apertured intermediate bight portion overlying and in aperture burr scraped contact with ground contact pads on the board. Barbed-end spring fingers extend integrally from the bight portion preferably toward the board side edge to which it affixed and into scraped contact with respective ones of the metal cover parts as the metal cover parts are assembled together. The clips hold the board from movement in the cover and electrically ground any static electrical charges on the metal cover parts to the contact pads and to a ground socket in the frame, and electrically ground the metal cover parts to provide electromagnetic shielding of the electrical circuitry on the wiring board.

24 Claims, 2 Drawing Sheets

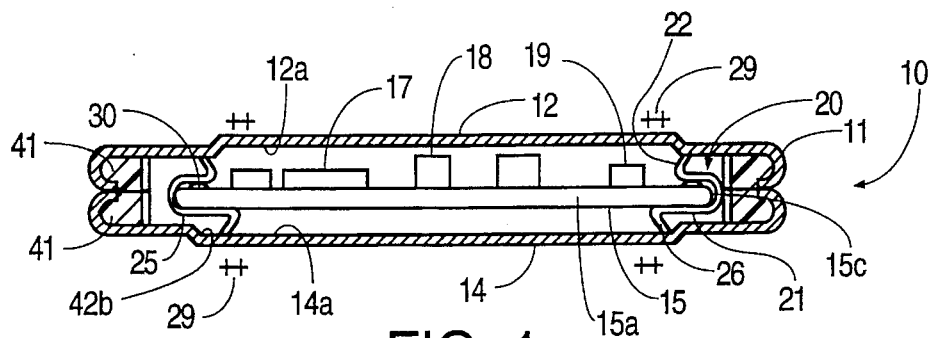
FIG. 1
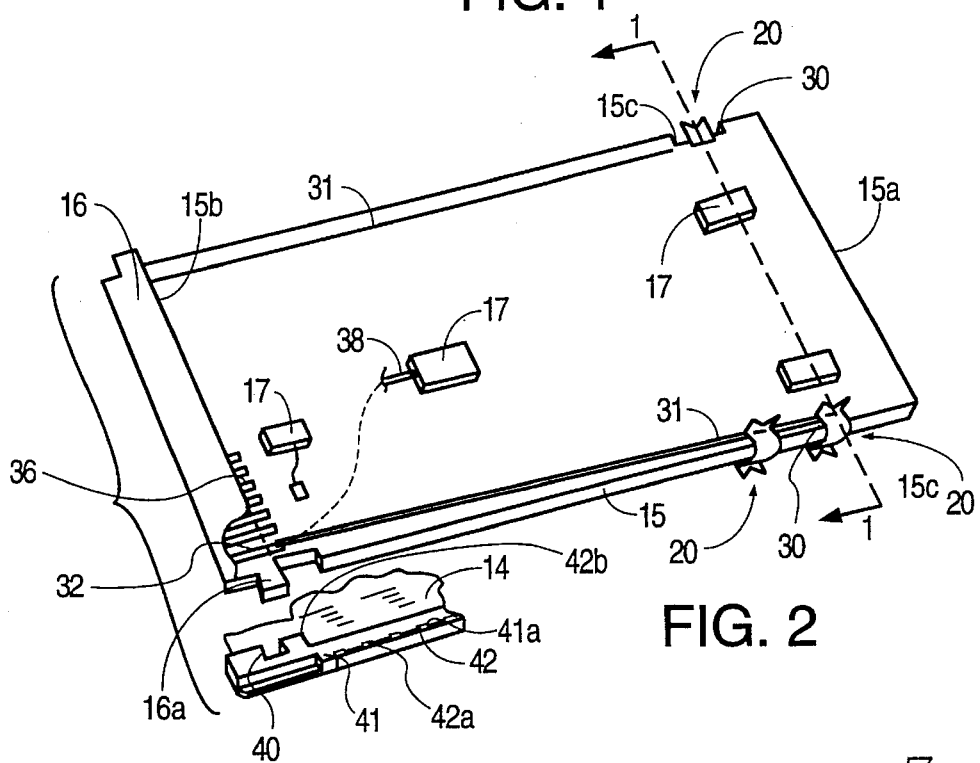
FIG. 2
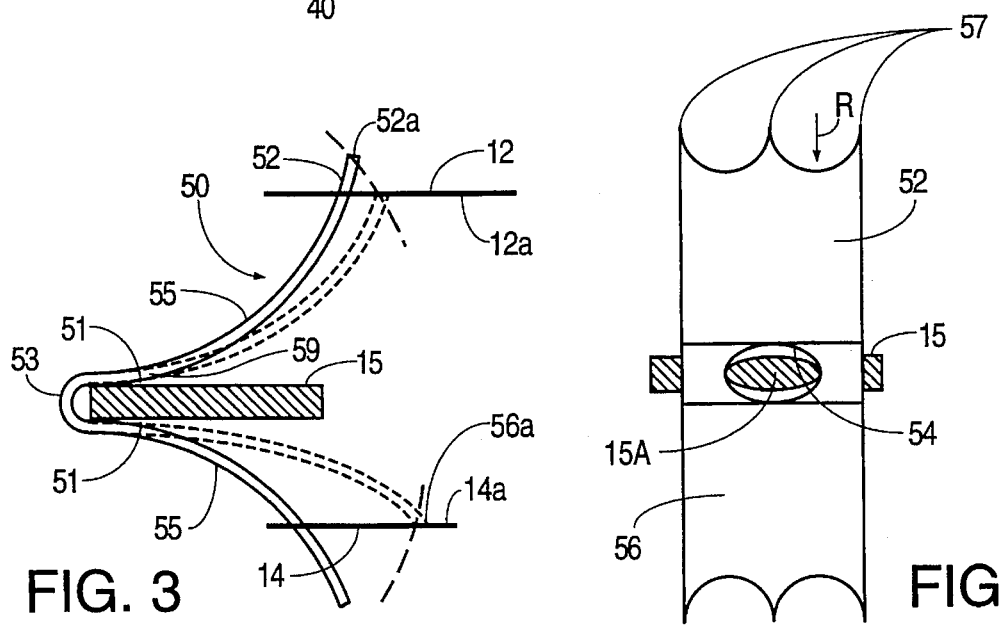
FIG. 3
FIG. 4

SPRING GROUNDING CLIP FOR COMPUTER PERIPHERAL CARD

BACKGROUND OF THE INVENTION

1. Field of Invention

The present invention relates to the packaging of electronic assemblies. More particularly, it is directed to a spring grounding clip and its combination with a computer peripheral or memory card.

2. Description of Related Art

Electronic assemblies are useful in a wide variety of electronic systems for ease of configuration of specific capabilities of such a system. One such type of assembly includes interface devices which plug into either a serial or parallel port of a personal computer (PCs), such as security keys, video adapters, and LAN interfaces. Another such type of assembly are peripheral cards for personal computers. Until recently, most card were unprotected circuit boards, having edge connectors and carrying a variety of circuit components soldered thereto, and which cards were installed into a PC by opening the case of the PC and inserting the card's edge connector into a mating backplane connector.

Recently, a new type of PC peripheral card standard was adopted by the industry known as the PCMCIA card. Even though originally developed for memory expansion cards (the acronym "PCMCIA" stands for "Personal Computer Memory Card International Association"), this standard has since seen wide adoption in a wide variety of peripheral cards, such as RAM (volatile memory), FLASH EEPROM (non-volatile memory), hard disks, FAX/modems, data acquisition interfaces, and LAN interfaces, and has become virtually standard fare for recently introduced laptop, sub-laptop, and personal digital assistant (PDAs) computers. PCMCIA Interfaces are also available for more traditional desktop computers, as well.

PCMCIA cards are very popular because of their small size, standardized interface, standardized form factor, ease of end-user installation, and lower risk of end-user caused damage to a host electronic system. Nonetheless, cost is still a major issue, and lower cost is still desired. Due to the extremely small size of a PCMCIA card, packaging costs are potentially higher than larger format packaging solutions. Assembling a PCMCIA card typically requires high precision, surface-mount, printed wiring board (PWB) manufacturing techniques.

A typical PCMCIA card or other type peripheral card including a memory card hereafter collectively called a "peripheral card" includes a printed wiring board (PWB) and attached circuit components including a board connector, various surface-mounted integrated circuit chips, other electronic components and plated electrical traces extending between such components. In some applications, such as data encryption or decryption, a battery source of power and various electronic components maybe contained on either or both sides of the peripheral card as well as components with plated vias extending through the PWB. A two-part overlying protective metal-plastic cover has been employed where the peripheral card is clamped between the two parts of the cover with the peripheral card cantilevered from a connector end edge of the peripheral card and held in place by abutting clamped edges of the cover parts. The desirability of dissipating any electrical static charge on the metal cover as well as a need to provide a means to ground the conductive case for the purpose of shielding the card from radiating or receiving electro-magnetic interference (EMI) has been recognized. Others have used separate C-shaped spring clips available from Molex, Inc. of Springfield, Ill. or Z-shaped spring clip available from Duel Systems, Inc. of San Jose, Calif., each extending from opposite sides of the PWB to a facing metal cover part to both space the PWB from the cover inner surfaces and provide an electrical ground path from the metal of the cover part to the ground circuit of the printed circuit board. The C-clips or Z-clips have a height such that the height of electronic components on the PWB are accommodated and the components do not contact the metal covers. While the C- and Z-clips when compressed by the cover plates do have some wiping action such wiping tends to cause the clips to be forced off away from the conductive pad on the surface of the PWB edge. In still another system, namely in a HP 512 RAM memory card, coil springs are positioned in PWB insulative bores. The coils extend from opposite sides of the PWB toward the cover parts and are adapted to be compressed between the cover parts. This acts to space the PWB when the cover parts are clamped together and subsequently joined together such as by pressure sensitive adhesive foam. In this system, a special housing and special tooling is needed to accommodate an additional clip which electrically contacts the cover through the coil springs.

In the event the PWB is to be offset between the protective covers due to the greater height of components on one side of the PWB, it is necessary that two different sizes of C-clip or Z-clips be employed to accommodate the different heights. Further, if the components are all on one side of the PWB, it would still be necessary to flip the PWB over to put a spring contact pad on the PWB underside on which the underside clip would abut and via a plated via conduct a static charge to a trace and ground socket or pin on the component-containing side of the PWB. This also adds process steps and needs additional tooling, both of which adds to production costs. Use of different sizes of clips also increases tooling and process cost. If one were to use an intermediate size to accommodate the different spacings too little force would be put on the PWB on one side and too much force would be put on the opposite side of the PWB.

The four C- or Z-clips which are used in the prior art result in different forces on the PWB due to different compression of the clips by the cover parts due to the PWB offset. These unequal forces tend to force the clips off of the PWB surface grounding pads and cause the board to impart stress to the laminated board and plated copper traces. The grounding clips of the above related art all tend to be compressed against the contact pads on the PWB which compression also compresses any contaminant such as oils or oxides on the surface of the contact area.

From the above, there has been a need of a grounding clip which can balance the forces on the PWB while assuring that the clips stay on the PWB and fully function to discharge any static electrical charge on the peripheral card cover parts to the grounding sockets in the peripheral card, provide a means for electro-magnetic shielding by grounding the conductive case, and provide a wiping action which tends to break through any oxide or contamination layer between the clip and the conductive surface of the case.

SUMMARY OF THE INVENTION

The present invention provides a packaging assembly for a peripheral card in which a single integral band of spring material, typically phosphorous bronze or beryllium copper, bent essentially 180° at an intermediate portion of the band, so that a resultant bight or intermediate portion can be snugly pushed against the lateral side edges of the PWB into contact with contact pads on one or both sides of the PWB. Integral spring fingers extend from the bight portion and are oppositely bent such that, when the cover parts are clamped against each other, the spring fingers are compressed by the covers. The outer edges of the spring fingers, which are preferably barbed to provide redundant contact points, wipe transversely from the side edges of the PWB and clean a linear contact area on inside metal surfaces of the cover parts and thus, make desired electrical grounding contacts with the cover parts. An aperture or apertures are provided in the spring band adjacent to what will become the 180° bend so that solder can be accessed into the area of contact of the band bight portion to a contact pad(s) on the PWB. In one embodiment, the integral spring arms are of equal length and are bent over a convexly curved radius, typically about 0.150" (3.81 mm.)

In a preferred embodiment for a PWB offset in the peripheral card, the spring fingers (or moment arms) are of unequal length and are bent at an angle of 30° and 35°, respectively to form triangular spring sections, the open ends of which each extends oppositely from the open end of the 180° bend forming the bight or intermediate portion of the spring band. In this preferred embodiment the spring grounding clip includes a continuous electrically conductive spring band having a first bend of more than 90° inboard of a first band end forming an angular integral first spring finger; a second bend of substantially 180° forming a substantially linear first intermediate band portion between said first angular bend and said second angular bend and forming a substantially linear integral second intermediate band portion parallely spaced from said first intermediate band portion; and a third bend of more than 90° inboard of a second band end forming an angular integral second spring finger extending from said second intermediate band portion to an opposite end of said band.

In each embodiment, the band ends preferably include a pair of spaced barbs at the outer edges of each end for assisting in the wiping i.e. scraping and cleaning action.

Additionally, the invention includes a peripheral card having a planar printed wiring board for surface mounting circuit components including one or more integrated circuits, and an edge mounted connector(s) which contains a series of individual contacts or sockets electrically connected to the circuit components, including at least one ground contact or socket. An overlying two-part protective metal cover is generally spaced from the card and at least one spring grounding clip physically spaces a portion of the wiring board from the cover parts and grounds the cover parts to the at least one ground connector. The grounding clip includes a first spring finger at one end abutting an inner surface of one part of the cover, an integral bight portion overlying side edges of the wiring board and in grounding electrical contact with at least one side of the wiring board; and an integral second spring finger at an opposite end of the clip abutting an inner surface of a second part of the cover, such that one clip or preferably two clips holds the wiring board from unwanted movement and electrically grounds through a controlled discharge path any static electric charges formed on the cover.

BRIEF DESCRIPTION OF THE DRAWINGS

FIG. 1 is a schematic partial cross-sectional transverse view of the peripheral card interior taken on the line 1—1 of FIG. 2 showing the spring grounding clips and, in section the protective cover parts.

FIG. 2 is a schematic perspective view of the wiring board and the grounding signal path thereon and a partial view of one corner of one cover part showing the assembly of the PWB to the PWB-mounting connection block.

FIG. 3 is a schematic cross-sectional view of a first embodiment of the invention.

FIG. 4 is a side partial view of the spring grounding clip and wiring board thereof.

DETAILED DESCRIPTION

Figure 5:
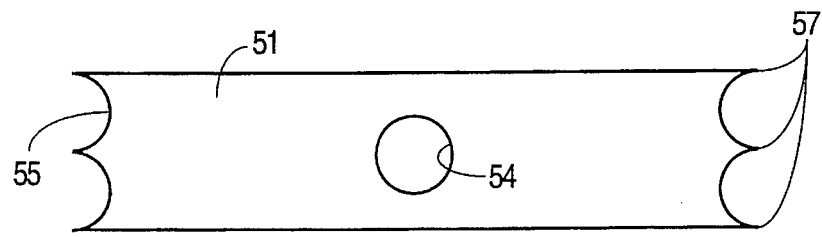
FIG. 5 is a plan view of the spring ground clip in punched blank form prior to bending.

As seen in FIG. 1 a peripheral card 10 includes a two-part cover 11 of metal and plastic having a generally planar metal top part 12 and a matching generally planar metal bottom part 14. A printed wiring board (PWB) 15 having a cantilevered end 15a extends from a plastic connection block 16 to which the other end 15b (FIG. 2) of the PWB is attached. The free end 15a of the PWB is spaced between the inside surfaces 12a and 14a of cover parts 12 and 14, respectively. In a preferred embodiment and in order to accommodate higher heights of certain electronic components 17, 18 and 19 on one side of the PWB, the PWB is asymmetrically positioned or offset within the cover 11 i.e., the PWB is closer to surface 14a than to surface 12a.

Figure 7:
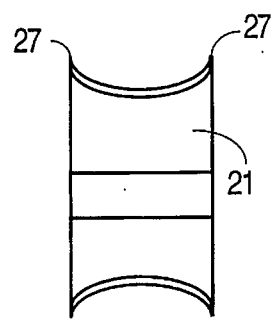
FIG. 7 is left side view thereof.
Figure 8:
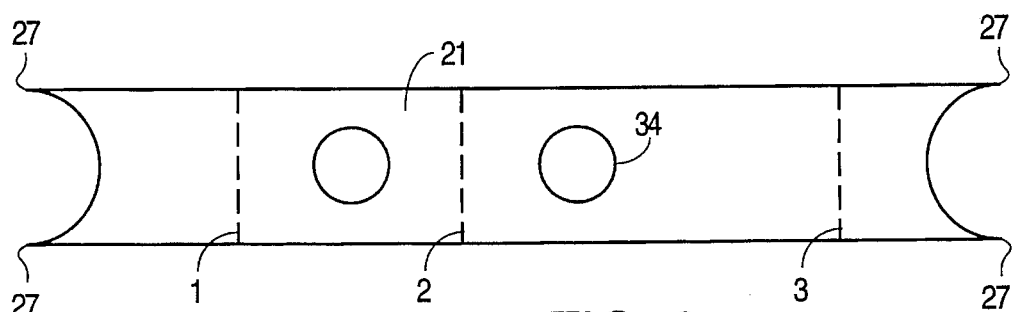
FIG. 8 is a plan view thereof in punched blank form prior to bending.

The spring grounding clip 20 of the invention is a band 21 of spring material such as half hard 510 phosphorous bronze or 2.25% beryllium 97.4% copper alloy, having a thickness of about 6 mils (0.152 mm), a width of about 0.25 cm. and a total blank length of 0.636 inches (1.62 cm.). The preferred clip 20 as seen in detail in FIGS. 6, 7, 8, 9 and 10 includes three bends, a first bend 1 of more than 90° forming an angular integral first spring finger 22; a second bend 2 of substantially 180° forming a substantially linear first intermediate band portion 23 between bends 1 and 2 and forming a substantially linear integral second intermediate band portion 24 parallely spaced from first intermediate band portion 23. Together bend 2 and band portions 23 and 24 form an integral bight portion 25 which is pushed onto the edge 15c of the PWB and into grounding contact with a contact pad 30 on the PWB. A third bend 3 of more than 90° adjacent to and inbound of the opposite end of band 21 forms an angular integral second spring finger 26 extending from band portion 24. The tip ends of spring fingers 22 and 26 contain barbs 27 (FIGS. 7 and 8) which wipe across and scrape the inner surfaces 12a and 14a of the cover parts to remove any oxide, grease or other contaminants thereby forming an effective grounding contact between clip fingers 22 and 26 and the cover parts to discharge any static charge 29 which may start to build up on the metal surface of the cover parts or ground plane of the PWB and complete the grounding of the cover for EMI shielding purposes.

Figure 6:
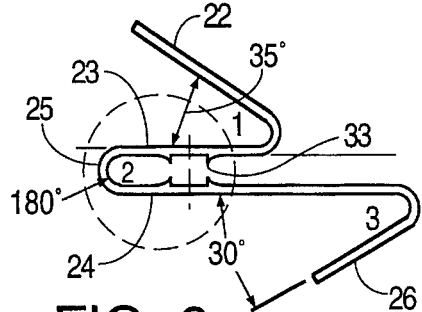
FIG. 6 is an end view of a preferred embodiment of the spring grounding clip per se in bended form.
Figure 9:
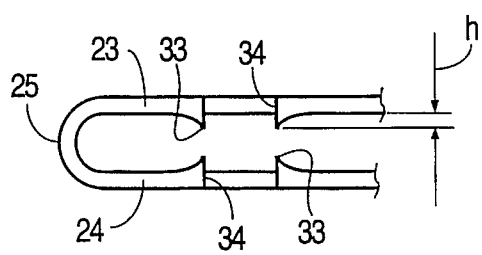
FIG. 9 is a detailed side view of the circled bight area of FIG. 6.
Figure 10:
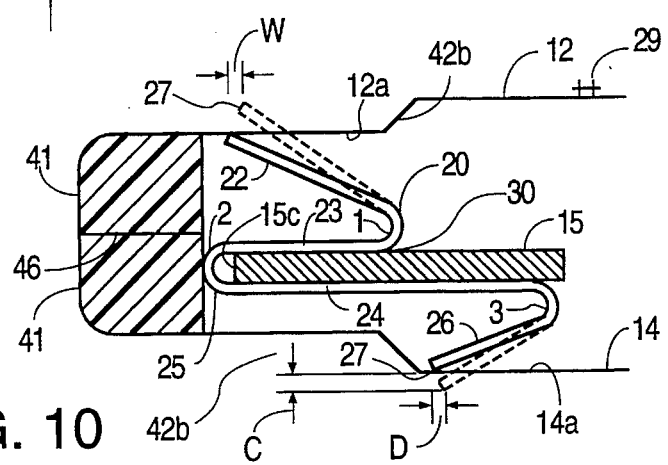
FIG. 10 is a schematic transverse cross-sectional view showing the wiping and compression operation of the spring grounding clip against the cover parts and wiring board.

As seen in FIGS. 6 and 10 the bight portion 25, particularly intermediate band portions 23 and 24, contact the contact pads 30 on the PWB which, in turn are connected to conductive grounding trace(s) 31 on the PWB which extends to ground socket(s) 32 in the multi-socketed connector block 16. Electrical ground pins (not shown) in the mating computer port into which the peripheral card 10 is to be inserted have a greater length than the other input/output pins, so that any charge on the metal cover parts 12 and 14 are first discharged prior to connection of the input/output pins into the input/output sockets 32 of connection block 16. The contact pad 30 typically is a copper pad with a gold flash thereon and extends linearly over a length greater than the length of the clip portion 24. As seen in FIGS. 6 and 9 in order to form a clean good electrical contact, burrs 33 formed by the punching of solder access apertures 34 in the band portions 23 and 24, are employed to scrape the contact pads 30 when the clips are pushed over the side edges of the PWB and to wipe or scrape off any contact surface contaminants. The burrs have a height "h" from about 1 to about 3 mils. Solder such as conventional tin-lead solder may be dispensed into aperture 34 to assure a good grounding contact and to further secure the clip to the grounding contact pad 30.

An additional grounding trace 38 may also extend from any component 17 directly to a grounding socket 32 to provide a return signal path from that or other component having similar grounding traces connected thereto. Sufficient space (FIG. 1) is also provided between the PWB and surface 14a to accommodate a flat (1.4 mm thick) lithium or other battery (not shown) for powering the peripheral card, if needed.

FIG. 2 also illustrates the mounting of the PWB 15 and the connection block 16 to the cover part 14. The ends of the connecting block 16 each include a tongue 16a having slightly wedge-shaped sides, the bottom half of which is mounted into a mating wedge-sided groove 40 on a plastic U-shaped frame 41 mounting the metal sides 42 of the cover part 14 (and cover part 12). Tongues 42a on the longitudinal edges of metal sides 42 interfit with grooves 41a in the sides of frame 41. A recess 42b in side 42 extends peripherally around the metal sides, the side edges and the end edge adjacent PWB end 15a being parallel to the plastic frame 41 extending from the ends of connection block 16. The barbed ends of the spring clips placed on opposite longitudinal side edges of the PWB, more particularly the ends of spring fingers 22 and 26 abut respectively, a surface 12a and the recess 42b on the inside of the cover metal sides at 14a, making a desired grounding contact.

As shown on FIG. 10, after the grounding clip has been pushed onto the edge 15c of PWB 15 so that band intermediate portions 23 and 24 partially extend over and abut the PWB, the cover parts 12 and 14 are brought together by clamping prior to ultrasonic welding to compress spring fingers 22 and 26 so that the fingers move from the dash line position to the full line position. The compression action causes the barb ends 27 (FIGS. 7 and 8) to wipe and scrape across wiping distance "W" nominally for about 16 mils as to spring finger 22 and a distance "D" of about 9 mils as to spring finger 26, resulting in a clean finger-to-casing part electrical grounding contact on the inner surfaces 12a and 14a of the metal cover parts. In this embodiment the barb 27 of spring finger 22 contacts and wipes surface 12a outboard of recess 42b while barb 27 of spring finger 26 contacts and wipes surface 14a inboard of recess 42b. In this operation the spring fingers 22 and 26 are compressed 20 mils and 13 mils ("C"), respectively. Since the moment arm of spring finger 22 is longer than that of spring finger 26 and given the above different compression distances, since length (l)× compression (d) equals the spring rate, the above dimensioned spring fingers result in balanced forces on the opposed sides of the PWB. Wiping or scraping action is in an opposite direction than the clip insertion direction and thus the wiping tends to pull, by an opposite reaction force, the clip more onto the PWB, while assuring adequate electrical grounding contact. This action is unlike that of the prior art separate C-shaped, Z-shaped or coil springs, one on each top and one on each bottom of the PWB which tend to be pushed off the PWB and where each clip transversely presses against the cover while compressing any contaminant on the PWB. At this time the cover parts of the invention can be ultrasonically welded along their facing peripheral edges 46 to permanently close the two-part cover 11 encompassing the spring clips 20.

A series of clips 20 of the same or larger width (as shown at the right front edge of FIG. 2) or a limited number of clips of wide width, for example from about 1 to about 6 cm., may be utilized along the longitudinal edges and the cantilevered edge of the PWB for substantially shielding and minimizing any gap at the interface between the metal cover parts against electromagnetic interference signals into or out of electronic components on the peripheral card. This is particularly advantageous when CMOS circuity is employed in the integrated circuit(s) since such integrated circuits are sensitive to both electromagnetic interference (EMI) and static discharge. Peripheral cards and the devices in which the cards are used are subject to FCC emission regulations and the grounding and shielding characteristics of the peripheral card and clips of the invention reduce EMI emissions and provide a controlled discharge path for static energy.

FIGS. 3, 4 and 5 show a further embodiment of the invention where a spring band 50 includes a single aperture 54 and triple barbs 57 on each end of the spring band formed by radii R. The first and third bends are concave curved bends 55 and are of less than 90°. The middle bend 53 is approximately 180°. When the top cover part 12 and bottom cover part 14 (shown schematically) are brought together the uncompressed spring fingers 52 and 56 of the blank (shown in full line) are compressed to the dashed line position. During the compression the barbed ends 52a and 56a scrape the respective inside surfaces 12a and 14a of the cover parts 12 and 14 to give final desired redundant grounding contacts with the metal cover parts. The wiping action direction is opposite to that of the preferred embodiment and there is some tendency for the clip to be pushed off the PWB as in prior art devices. However, in this embodiment the compression of the spring fingers 52 and 56 also tend to force the fingers at their root or bight portion 59 inwardly against the top of the PWB so that the inner surfaces at 59 clamp on contact pads 51 on the top and bottom of the PWB. In this embodiment due to the PWB being closer to the bottom cover part 14 than the top cover part 12 and the fingers 52 and 56 being of equal length, typically there will be a 64 mil compression distance at the bottom and only a 20 mil compression distance at the top, resulting in unequal forces on the PWB. The wiping distances over the bottom and top cover parts will be 36 mils and 14 mils, respectively when a spring blank of 0.45 inches (11.43 mm) is utilized and the fingers are initially bent to form a 0.190 inch radiused (4.83 mm) concave curve. A single central aperture 54 is provided so as to provide a solder access for making a solder joint around the clip-to-contact pad 51 abutment.

The above description of embodiments of this invention is intended to be illustrative and not limiting. Other embodiments of this invention will be obvious to those skilled in the art in view of the above disclosure.

We claim:

1. A spring grounding clip comprising a continuous electrically conductive spring band having a first bend inboard of a first band end forming an angular integral first spring finger;

a second bend of substantially 180° forming a substantially linear first intermediate band portion between said first angular bend and said second angular bend and forming a substantially linear integral second intermediate band portion parallely spaced from said first intermediate band portion; and a third bend inboard of a second band end forming an angular integral second spring finger extending from said second intermediate band portion to an opposite end of said band.

2. The spring grounding clip of claim 1 in which the angle of each of the first bend and the third bend is from about 20° to about 45° with respect to an associated one of said intermediate band portions.

3. The spring grounding clip of claim 2 in which the angle of the first bend is about 35°.

4. The spring grounding clip of claim 2 in which the angle of the third bend is about 30°.

5. The spring grounding clip of claim 2 in which an open angle of said first and third bends face in the same direction and toward an open end of said second bend.

6. The spring grounding clip of claim 1 wherein each of the ends of said bands include an end surface forming a pair of end barbs.

7. The spring grounding clip of claim 1 further comprising an aperture in at least one of said first and second intermediate band portions for solder accessing facing surfaces of said first and second intermediate band portions and a contact pad on a wiring board.

8. The spring grounding clip of claim 7 wherein edges of an underside of the at least one aperture includes burrs which face an opposed intermediate band portion in a bent mode of said spring band.

9. The spring grounding clip of claim 8 wherein the burrs extend from about 1 to about 3 mils from facing surfaces of said first and second intermediate band portions.

10. The spring grounding clip of claim 1 wherein the spring band comprises a phosphorous bronze band.

11. The spring grounding clip of claim 1 wherein the spring band comprises a beryllium copper band.

12. The spring grounding clip of claim 1 wherein said first and second spring fingers are asymmetrically spaced from said second bend both longitudinally and height-wise.

13. In combination, a peripheral card including a planar printed wiring board for surface mounting circuit components including an integrated circuit, and a connector including a series of connector contacts electrically connected to said circuit components, including at least one connector ground contact;

an overlying two-part protective conductive cover generally spaced from said card; and at least one spring grounding clip physically spacing a portion of said wiring board from said cover parts and grounding the cover parts to said at least one connector ground contact, said at least one clip comprising a first spring finger at one end of said at least one clip abutting an inner surface of one part of said cover, an integral bight portion overlying side edges of said wiring board and in grounding electrical contact with at least one side of said wiring board, and an integral second spring finger at an opposite end of said at least one clip abutting an inner surface of a second part of said cover, such that said at least one clip holds said wiring board portion from unwanted movement and electrically grounds said cover.

14. The combination of claim 13 wherein said spring fingers extend at an angle of from about 20° to about 45° from said bight portion.

15. The combination of claim 13 wherein ends of said first and second spring fingers include a curved end surface forming a pair of cover scraping barbs.

16. The combination of claim 13 further including at least one aperture adjacent to said bight portion for accessing a side of said bight portion to solder said bight portion to a contact pad on said wiring board.

17. The combination of claim 13 further comprising at least one aperture in said bight portion for solder accessing facing sides of said bight portion.

18. The combination of claim 13 including an electrically conducting grounding trace on said wiring board extending from said contact pad to said at least one connector ground contact and wherein said at least one connector ground contact is a ground socket.

19. The combination of claim 13 including a pair of grounding clips, each overlying said wiring board, said wiring board being cantilevered from an end portion of said cover supporting said connector.

20. The combination of claim 13 including apertures in said bight portion and wherein edges of an underside of each of the apertures includes burrs which scrape a contact pad on said wiring board when said bight portion is snugly pushed onto said wiring board to overlie the side edges of the wiring board.

21. The combination of claim 13 wherein the wiring board is asymmetrically spaced in the cover and the first and second spring fingers are asymmetrically spaced from said bight portion both longitudinally and heightwise.

22. The combination of claim 21 wherein said spring fingers have different lengths providing balanced forces against said wiring board.

23. The combination of claim 13 including a series of spring grounding clips extending about a periphery of said wiring board such that the combination of said cover and said series of grounding clips substantially shield against electromagnetic interference signals into and out of said peripheral card.

24. The combination of claim 13 including a limited number of ground clips each extending variously along each longitudinal side and a side opposite from a side containing said connector of a periphery of said wiring board, each of said clips having a width such that any ungrounded gaps between said first and second cover parts are minimized and the clips substantially shield against electromagnetic interference signals into and out of electronic components on said peripheral card.

* * * * *